United States Patent
Booth, Jr. et al.

(10) Patent No.: US 7,834,387 B2
(45) Date of Patent: Nov. 16, 2010

(54) METAL GATE COMPATIBLE FLASH MEMORY GATE STACK

(75) Inventors: Roger A. Booth, Jr., Wappingers Falls, NY (US); Deok-kee Kim, Bedford Hills, NY (US); Haining S. Yang, Wappingers Falls, NY (US); Xiaojun Yu, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 30 days.

(21) Appl. No.: 12/100,708

(22) Filed: Apr. 10, 2008

(65) Prior Publication Data

US 2009/0256211 A1    Oct. 15, 2009

(51) Int. Cl.
*H01L 29/788*    (2006.01)

(52) U.S. Cl. .................. 257/315; 257/314; 257/316; 257/288; 257/266; 438/211; 438/257; 438/264

(58) Field of Classification Search .............. 438/211, 438/257, 264; 257/315, 316, 266, E29.129, 257/E29.304–E29.306, E29.3, E21.179, E21.209, 257/E21.422, E21.423, E21.679
See application file for complete search history.

(56) References Cited

U.S. PATENT DOCUMENTS

| | | | | |
|---|---|---|---|---|
| 6,133,096 A | * | 10/2000 | Su et al. ................. | 438/264 |
| 2005/0023603 A1 | * | 2/2005 | Eldridge et al. ............ | 257/315 |
| 2006/0054943 A1 | * | 3/2006 | Li et al. ................... | 257/266 |
| 2006/0054953 A1 | * | 3/2006 | Son et al. .................. | 257/296 |
| 2006/0065938 A1 | * | 3/2006 | Ko et al. ................... | 257/410 |
| 2006/0292784 A1 | * | 12/2006 | Sohn et al. ................ | 438/201 |
| 2007/0063224 A1 | * | 3/2007 | Watanabe et al. .......... | 257/204 |
| 2007/0184606 A1 | * | 8/2007 | You et al. .................. | 438/211 |
| 2007/0228480 A1 | * | 10/2007 | Yen et al. .................. | 257/369 |
| 2008/0067606 A1 | * | 3/2008 | Jung et al. ................. | 257/369 |
| 2008/0188044 A1 | * | 8/2008 | Hsu et al. .................. | 438/211 |

* cited by examiner

*Primary Examiner*—Davienne Monbleau
*Assistant Examiner*—Farid Khan
(74) *Attorney, Agent, or Firm*—Scully, Scott, Murphy & Presser, P.C.; Joseph P. Abate, Esq.

(57) ABSTRACT

A first gate stack comprising two stacked gate electrodes in a first device region, a second gate stack comprising a metal gate electrode in a second device region, and a third gate stack comprising a semiconductor gate electrode in a third device region are formed by forming and removing portions of a silicon-oxide based gate dielectric layer, a first doped semiconductor layer, an interfacial dielectric layer, a high-k gate dielectric layer, a metal gate layer, and an optional semiconductor material layer in various device regions. The first gate stack may be employed to form a flash memory, and the second and third gate stacks may be employed to form a pair of p-type and n-type field effect transistors.

12 Claims, 17 Drawing Sheets

METAL GATE COMPATIBLE FLASH MEMORY GATE STACK

FIELD OF THE INVENTION

The present invention generally relates to semiconductor devices, and particularly to semiconductor structures including a flash memory gate stack, a metal gate structure, and a semiconductor gate structure, and methods of manufacturing the same.

BACKGROUND OF THE INVENTION

Advanced semiconductor chips require enhancement in performance through device performance as well as expanded offering in device types to enable multiple types of devices providing useful functionality. Oftentimes, providing both such enhancement in performance and multiple device types in the same semiconductor chip increases processing costs. Thus, providing as many device types as possible, while limiting processing complexity within reasonable limits, helps provide a highly functional semiconductor chip at a reasonable processing cost.

On one hand, a key performance parameter of advanced semiconductor chips is on-current and off-current of field effect transistors. Typically, high gate leakage current of silicon oxide and nitrided silicon dioxide as well as depletion effect of polysilicon gate electrodes limits the performance of conventional semiconductor oxide containing gate electrodes. High performance devices for an equivalent oxide thickness (EOT) less than 1 nm require high dielectric constant (high-k) gate dielectrics and metal gate electrodes to limit the gate leakage current and provide high on-currents. Materials for high-k gate dielectrics include $ZrO_2$, $HfO_2$, other dielectric metal oxides, alloys thereof, and their silicate alloys.

A high-k dielectric material needs to provide good electrical stability, that is, the amount of charge trapped in the high-k dielectric material needs to remain at a low level even after extended operation of a transistor. The high-k dielectric material needs to be scalable, that is, provide an acceptable level of leakage and acceptable levels of electron and hole mobility at a reduced thickness, e.g., less than 1 nm. High-k dielectric materials satisfying these conditions may be advantageously employed for high performance semiconductor devices.

In general, dual metal gate complementary metal oxide semiconductor (CMOS) integration schemes employ two gate materials, one having a work function near the valence band edge of the semiconductor material in the channel and the other having a work function near the conduction band edge of the same semiconductor material. In CMOS devices having a silicon channel, a conductive material having a work function of about 4.0 eV is necessary for n-type metal oxide semiconductor field effect transistors (NMOSFETs, or "NFETs") and another conductive material having a work function of about 5.0 eV is necessary for p-type metal oxide semiconductor field effect transistors (PMOSFETs, or "PFETs"). In conventional CMOS devices employing polysilicon gate materials, a heavily p-doped polysilicon gate and a heavily n-doped polysilicon gate are employed to address the needs. In CMOS devices employing high-k gate dielectric materials, two types of gate stacks comprising suitable materials satisfying the work function requirements are needed for the PFETs and for the NFETS, in which the gate stack for the PFETs provides a flat band voltage closer to the valence band edge of the material of the channel of the PFETs, and the gate stack for the NFETs provides a flat band voltage closer to the conduction band edge of the material of the channel of the NFETs. In other words, threshold voltages need to be optimized differently between the PFETs and the NFETs. In some cases, the conventional CMOS devices and metal gate devices may be formed on the same semiconductor substrate to avoid the complexity of processing two types of metal gate materials.

On the other hand, there has been a steady demand for non-volatile memory devices in advanced semiconductor chips. Such non-volatile memory devices include electrically programmable semiconductor fuses and flash memories. Electrically programmable semiconductor fuses provide a secure memory and tends to require a minimal number of additional processing steps in manufacturing, the electrically programmable semiconductor fuses are not erasable, i.e., programmable only once. For this reason, the electrically programmable semiconductor fuses are termed one-time programmable (OTP) memory devices.

Flash memory devices are erasable programmable non-volatile memories. Flash memory devices may store non-volatile information, i.e., the information stored in flash memories are not erased when power is turned off. Unlike electrically programmable semiconductor fuses, information stored in the flash memory devices may be erased and new data may be stored, i.e., the flash memory devices are rewritable. The flash memory devices, however, require a stack of two gate electrodes. As a consequence, additional processing steps are required to form flash memory devices, which increase processing time and processing cost.

In view of the above, there exists a need for a semiconductor structure including a gate stack that may be employed for a flash memory device, a gate stack for a p-type field effect transistor, and a gate stack for an n-type field effect transistor, for the manufacture of which processing complexity and cost are reduced to a minimum.

Further, there exists a need for a method of manufacturing such a semiconductor structure that with minimal processing complexity and cost.

SUMMARY OF THE INVENTION

The present invention addresses the needs described above by providing a first gate stack comprising two gate electrodes and configured for a flash memory device, a second gate stack configured for a p-type field effect transistor, and a third gate stack configured for an n-type field effect transistor, and methods of manufacturing the same.

In the present invention, a silicon-oxide based gate dielectric layer and a first doped semiconductor layer are formed over a semiconductor substrate in first and third device regions. An interfacial dielectric layer and a high-k gate dielectric layer are formed directly on a semiconductor substrate in a second device region and on the semiconductor gate electrode layer in the first and third device regions. A metal gate layer and an optional semiconductor material layer are formed thereupon. The metal gate layer, the high-k gate dielectric layer, and the interfacial dielectric layer are removed in the third device region to expose a top surface of the first doped semiconductor layer. A second doped semiconductor layer is formed by blanket deposition. The various layers are patterned to form a first gate stack comprising two stacked gate electrodes in the first device region, a second gate stack comprising a metal gate electrode in the second device region, and a third gate stack comprising a semiconductor gate electrode in the third device region. The first gate stack may be employed to form a flash memory, and the second and third gate stacks may be employed to form a pair of p-type and n-type field effect transistors.

According to an aspect of the present invention, a semiconductor structure is provided, which includes a gate stack comprising a semiconductor oxide containing gate dielectric portion abutting a top surface of a semiconductor substrate, a semiconductor gate electrode abutting the semiconductor oxide containing gate dielectric, a high-k gate dielectric portion comprising a dielectric metal oxide, having a dielectric constant greater than 4.0, and located above the semiconductor gate electrode, and a metal gate portion abutting a top surface of the high-k gate dielectric portion.

In one embodiment, the semiconductor structure further comprises a doped semiconductor portion abutting a top surface of the metal gate portion.

In another embodiment, the doped semiconductor portion comprises a lower semiconductor portion and an upper doped semiconductor sub-portion, the lower doped semiconductor sub-portion abuts the metal gate portion, and the upper doped semiconductor sub-portion abuts a top surface of the lower doped semiconductor portion. The lower doped semiconductor sub-portion may comprise a different material than the lower doped semiconductor sub-portion.

In even another embodiment, each of the semiconductor gate electrode, the lower doped semiconductor sub-portion, and the upper doped semiconductor sub-portion comprises one of silicon, germanium, a silicon-germanium alloy, a silicon carbon alloy, a silicon-germanium-carbon alloy, gallium arsenide, indium arsenide, indium phosphide, III-V compound semiconductor materials, II-VI compound semiconductor materials, organic semiconductor materials, and other compound semiconductor materials.

In yet another embodiment, the lower doped semiconductor portion and the upper doped semiconductor portion comprise different semiconductor materials.

In still another embodiment, the semiconductor structure further comprises:

a gate metal semiconductor alloy portion abutting a top surface of the doped semiconductor portion;

a source region, a source extension region, a drain region, and a drain extension region that are located in the semiconductor substrate, wherein the source extension region and the drain extension abuts the semiconductor oxide containing gate dielectric portion;

a gate spacer laterally abutting sidewalls of each of the semiconductor oxide containing gate dielectric portion, the semiconductor gate electrode, the high-k gate dielectric portion, and the metal gate portion;

a source side metal semiconductor alloy portion abutting the source region; and a drain side metal semiconductor alloy portion abutting the drain region.

In still yet another embodiment, the semiconductor structure further comprises an interfacial dielectric portion comprising an oxide of a material comprising the semiconductor gate electrode and vertically abutting a top surface of the semiconductor gate electrode and a bottom surface of the high-k gate dielectric portion.

In a further embodiment, the high-k gate dielectric portion comprises one of $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, an alloy thereof, and non-stoichiometric variants thereof, wherein each value of x is independently from about 0.5 to about 3 and each value of y is independently from 0 to about 2.

In an even further embodiment, the metal gate portion comprises one of Ru, Pd, Pt, Co, Ni, $Ta_xAl_yN$, $W_xC_yN$, Zr, W, Ta, Hf, Ti, Al, a metal carbide, a transition metal aluminide, a conductive metal oxide, and a combination thereof, wherein each value of x is independently from 0 to about 1 and each value of y is independently from 0 to about 1.

In a yet further embodiment, sidewalls of each of the semiconductor oxide containing gate dielectric portion, the semiconductor gate electrode, the high-k gate dielectric portion, and the metal gate portion may be substantially vertically coincident.

According to another aspect of the present invention, another semiconductor structure is provided, which comprises a first gate stack located in a first device region and the second gate stack located in a second device region, wherein the first gate stack comprises:

a semiconductor oxide containing gate dielectric portion abutting a top surface of a semiconductor substrate;

a semiconductor gate electrode abutting the semiconductor oxide containing gate dielectric;

a first high-k gate dielectric portion comprising a dielectric metal oxide, having a dielectric constant greater than 4.0, and located above the semiconductor gate electrode; and a first metal-semiconductor-stack gate electrode abutting a top surface of the first high-k gate dielectric portion and comprising a first metal gate portion and a first doped semiconductor portion, and wherein the second gate stack comprises:

a second high-k gate dielectric portion comprising the dielectric metal oxide; and a second metal-semiconductor-stack gate electrode abutting a top surface of the second high-k gate dielectric portion and comprising a second metal gate portion and a second doped semiconductor portion.

In one embodiment, the second high-k gate dielectric portion abuts the top surface of the semiconductor substrate.

In another embodiment, the semiconductor structure further comprises:

a first interfacial dielectric portion comprising an oxide of a material comprising the first semiconductor gate electrode and vertically abutting a top surface of the first semiconductor gate electrode and a bottom surface of the first high-k gate dielectric portion; and a second interfacial dielectric portion comprising a same material as the first interfacial dielectric portion and vertically abutting the top surface of the semiconductor substrate and a bottom surface of the second high-k gate dielectric portion.

In even another embodiment, the semiconductor structure further comprises a third gate stack located in a third device region, wherein the third gate stack comprises:

another semiconductor oxide containing gate dielectric portion abutting the top surface of the semiconductor substrate and comprising a same material as the semiconductor oxide containing gate dielectric portion; and another semiconductor gate electrode comprising a lower doped semiconductor portion and an upper doped semiconductor portion, wherein the lower doped semiconductor portion abuts the another semiconductor oxide containing gate dielectric portion and the upper doped semiconductor portion abuts the lower doped semiconductor portion.

In yet another embodiment, the lower portion has a same composition as the semiconductor gate electrode, and the upper portion, the first doped semiconductor portion, and the second doped semiconductor portion have a same composition.

According to yet another aspect of the present invention, a method of forming a semiconductor structure is provided, which comprises:

forming a silicon-oxide based gate dielectric layer on a semiconductor substrate;

forming a first doped semiconductor layer on the silicon-oxide based gate dielectric layer;

forming a high-k gate dielectric layer over the first doped semiconductor layer and an exposed portion of a top surface of the semiconductor substrate; and forming a metal gate layer on the high-k gate dielectric layer.

In one embodiment, the method further comprises removing the first doped semiconductor layer and the silicon-oxide based gate dielectric layer from a second device region, while maintaining the first doped semiconductor layer and the silicon-oxide based gate dielectric layer in a first device region and in a third device region.

In another embodiment, the method further comprises patterning a first gate stack in a first device region and a second gate stack in a second device region, wherein the first gate stack comprises:

a semiconductor oxide containing gate dielectric portion patterned from silicon-oxide based gate dielectric layer;

a semiconductor gate electrode patterned from the first doped semiconductor layer;

a first high-k gate dielectric portion patterned from the high-k gate dielectric layer; and a first metal-semiconductor-stack gate electrode abutting a top surface of the first high-k gate dielectric portion and comprising a first metal gate portion which is patterned from the metal gate layer, and wherein the second gate stack comprises:

a second high-k gate dielectric portion patterned from the high-k gate dielectric layer; and a second metal-semiconductor-stack gate electrode abutting a top surface of the second high-k gate dielectric portion and comprising a second metal gate portion which is patterned from the metal gate layer.

In even another embodiment, the high-k gate dielectric layer is formed directly on the semiconductor substrate in the second device region and directly on the first doped semiconductor layer in the first device region.

In yet another embodiment, the method further comprises forming an interfacial dielectric layer directly on the first doped semiconductor layer and an exposed portion of the semiconductor substrate, wherein the first gate stack comprises a first interfacial dielectric portion abutting the semiconductor gate electrode and the first high-k gate dielectric portion, and wherein the second gate stack comprises a second interfacial dielectric portion abutting the semiconductor substrate and the second high-k gate dielectric portion.

In still another embodiment, the method further comprises forming a second doped semiconductor layer over the metal gate layer in the first device region and the second device region and directly on the first doped semiconductor layer in a third device region.

In still yet another embodiment, the method further comprises forming a third gate stack in the third device region, wherein the third gate stack comprises another semiconductor oxide containing gate dielectric portion patterned from silicon-oxide based gate dielectric layer and another semiconductor gate electrode comprising a lower doped semiconductor portion and an upper doped semiconductor portion, wherein the lower doped semiconductor portion is patterned from the first doped semiconductor layer and the upper doped semiconductor portion abuts the lower doped semiconductor portion and is patterned from the second doped semiconductor layer.

DETAILED DESCRIPTION OF THE INVENTION

Figure 1:
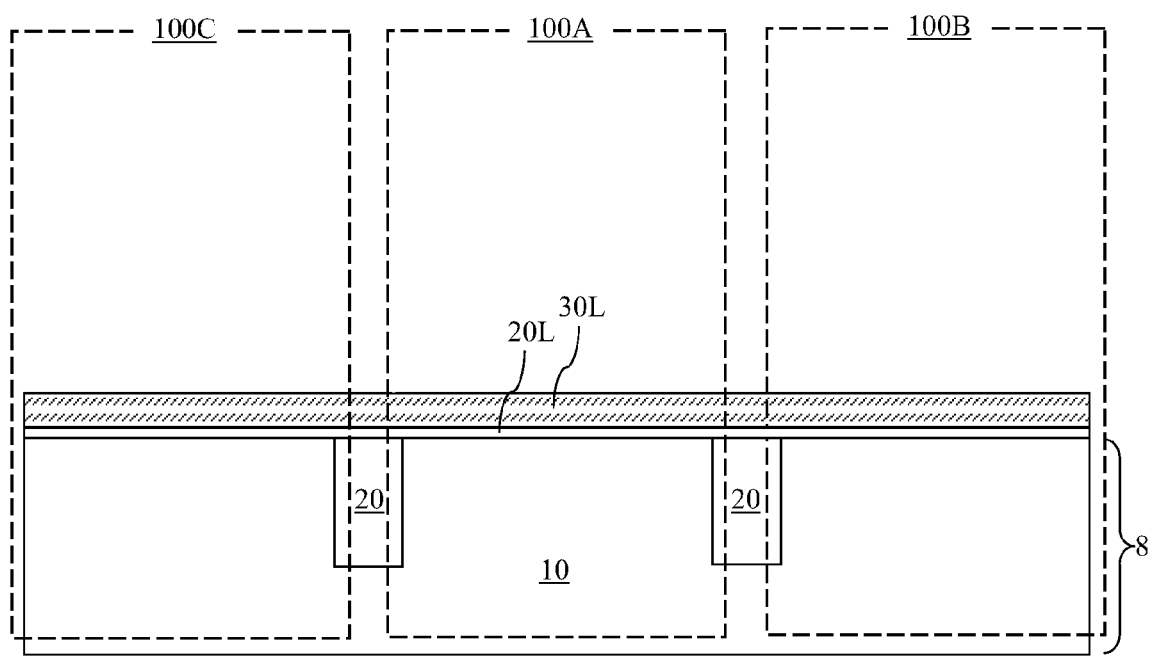
FIGS. 1-14 are sequential vertical cross-sectional views of a first exemplary semiconductor structure according to processing steps a first embodiment of the present invention.

As stated above, the present invention relates to semiconductor structures including a flash memory gate stack, a metal gate structure, and a semiconductor gate structure, and methods of manufacturing the same, which are now described in detail with accompanying figures. It is noted that like and corresponding elements mentioned herein and illustrated in the drawings are referred to by like reference numerals. It is also noted that proportions of various elements in the accompanying figures are not drawn to scale to enable clear illustration of elements having smaller dimensions relative to other elements having larger dimensions.

Referring to FIG. 1, a first exemplary semiconductor structure according to a first embodiment of the present invention comprises a semiconductor substrate 8 containing a substrate semiconductor layer 10 comprising a semiconductor material, which may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. Preferably, the substrate semiconductor layer 10 is single crystalline, i.e., have the same set of crystallographic orientations, or "epitaxial."

The semiconductor substrate 8 may be a bulk substrate, a semiconductor-on-insulator (SOI) substrate, or a hybrid substrate having a bulk portion and an SOI portion. While the first embodiment is described with a bulk substrate, embodiments employing an SOI substrate or a hybrid substrate are explicitly contemplated herein.

The substrate semiconductor layer 10 may include at least one doped region, each having a p-type doping or an n-type doping. For clarity, the at least one doped region is not specifically shown in the drawings of the present application. Each of the at least one doped region is known as a "well" and may be formed utilizing conventional ion implantation processes.

The first exemplary semiconductor structure comprises a first device region 100A, a second device region 100B, and a third device region 100C, which are mutually exclusive of one another. Each of the first device region 100A, the second device region 100B, and the third device region 100C comprises an area in which at least one device is to be formed. While the present invention is described with three transistors, each of the first device region 100A, the second device region 100B, and the third device region 100C may contain a plurality of devices comprising the same type of gate stacks located within the same device region. Such variations are explicitly contemplated herein. The first device region 100A, the second device region 100B, and the third device region 100C may be separated from one another by shallow trench isolation structures 20 or deep trench isolation structures (not shown). The shallow trench isolation structure 20 comprises a dielectric material such as silicon oxide or silicon nitride, and is formed by methods well known in the art.

A semiconductor oxide containing gate dielectric layer 20L is formed on the top surface of the substrate semiconductor layer 10. The semiconductor oxide containing gate dielectric layer 20L comprises an oxide of the semiconductor material of the substrate semiconductor layer 10. The semiconductor oxide containing gate dielectric layer 20L may be a layer of an oxide or an oxynitride of the semiconductor material of the substrate semiconductor layer 10. Alternately, the semiconductor oxide containing gate dielectric layer 20L may be a stack of multiple dielectric layers in which one layer comprises an oxide of the semiconductor material of the substrate semiconductor layer 10. In case the substrate semiconductor layer 10 comprises silicon, the semiconductor oxide containing gate dielectric layer 20L comprises silicon oxide or silicon oxynitride.

Preferably, the semiconductor oxide containing gate dielectric layer 20L has a dielectric constant less than 8.0. For example, the semiconductor oxide containing gate dielectric layer 20L may be silicon oxide which has a dielectric constant of about 3.9 or a silicon oxynitride which has a dielectric constant between the dielectric constant of silicon oxide, which is 3.9, and the dielectric constant of silicon nitride, which is 7.5. The thickness of the semiconductor oxide containing gate dielectric layer 20L may be optimized for performance as a gate dielectric, and may be from about 1.0 nm to about 6.0 nm, and typically from about 1.2 nm to about 2.5 nm, although lesser and greater thicknesses are also explicitly contemplated herein.

A first doped semiconductor layer 30L is formed directly on the top surface of the semiconductor oxide containing gate dielectric layer 20L in the PFET region 200 by chemical vapor deposition (CVD) such as low pressure chemical vapor deposition (LPCVD), rapid thermal chemical vapor deposition (RTCVD), plasma enhanced chemical vapor deposition (PECVD), etc. The first doped semiconductor layer 30L may be formed by deposition of an undoped layer of semiconductor layer followed by implantation of dopants, or more preferably, may be formed by deposition of in-situ doped layer of a semiconductor material. The first doped semiconductor layer 30L may be amorphous or polycrystalline, and comprises a semiconductor material such as silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. The thickness of the first doped semiconductor layer 30L may be from about 10 nm to about 100 nm, and typically from about 20 nm to about 60 nm, although lesser and greater thicknesses are also explicitly contemplated herein.

The composition and the doping of the first doped semiconductor layer 30L, and as a consequence, the work function of the first doped semiconductor layer 30L, is selected to optimize the threshold voltage of a transistor to be subsequently formed in the third device region 100B. In case the transistor to be subsequently formed in the third device region 100B is a p-type field effect transistor, the first doped semiconductor layer 30L may comprise a material having a work function between a valence band edge of the semiconductor material of the substrate semiconductor layer 10 and a mid-band-gap energy level of the semiconductor material of the substrate semiconductor layer 10 p-doped silicon. For example, if the substrate semiconductor layer 10 comprises silicon, the first doped semiconductor layer 30L may comprise p-doped polysilicon or a p-doped silicon containing semiconductor alloy so that the wok function of the first doped semiconductor layer 30L is close to the valence band edge of the silicon energy band structure. In case the transistor to be subsequently formed in the third device region 100B is an n-type field effect transistor, the first doped semiconductor layer 30L may comprise a material having a work function between a conduction band edge of the semiconductor material of the substrate semiconductor layer 10 and a mid-band-gap energy level of the semiconductor material of the substrate semiconductor layer 10 p-doped silicon. For example, if the substrate semiconductor layer 10 comprises silicon, the first doped semiconductor layer 30L may comprise n-doped polysilicon or an n-doped silicon containing semiconductor alloy so that the work function of the first doped semiconductor layer 30L is close to the conduction band edge of the silicon energy band structure.

Figure 2:
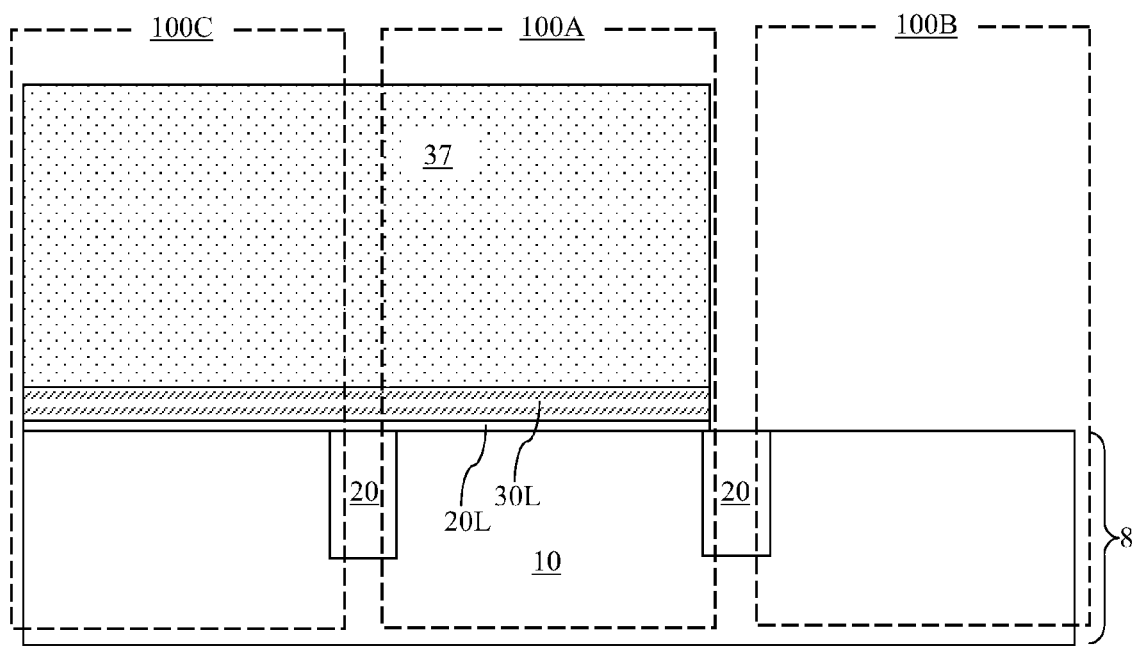

Referring to FIG. 2, a first photoresist 37 is applied over the first doped semiconductor layer 30L and lithographically patterned so that the portion of the first doped semiconductor layer 30L in the first and third device regions (100A, 100C) is covered by the first photoresist 37, while the portion of the first doped semiconductor layer 30L in the second device region 100B is exposed. Employing the first photoresist 37 as an etch mask, the portion of the first doped semiconductor layer 30L in the second device region 100B and the portion of the semiconductor oxide containing gate dielectric layer 20L are removed by an etch, which may be a dry etch or a wet etch. A top surface of the substrate semiconductor layer 10 is exposed in the second device region 100B. The first photoresist 37 is subsequently removed.

Figure 3:
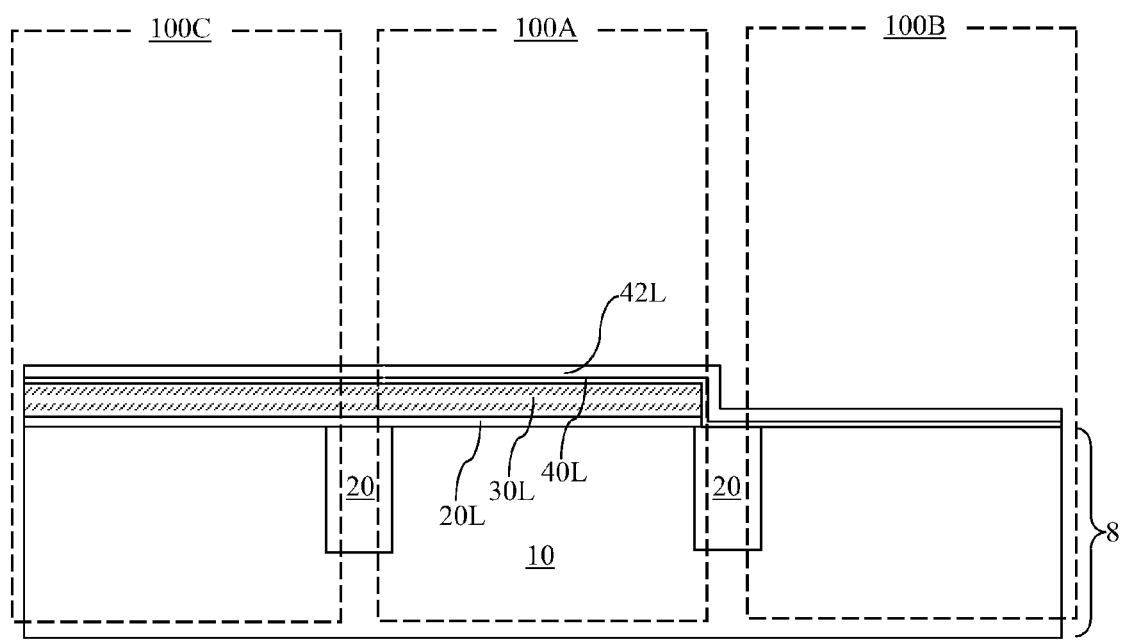

Referring to FIG. 3, an interfacial dielectric layer 40L is formed directly on the substrate semiconductor layer 10. The interfacial dielectric layer 40L may comprise a semiconductor oxide, a semiconductor oxynitride, or a semiconductor nitride. In case the substrate semiconductor layer 10 comprises silicon, the interfacial dielectric layer 40L may comprise silicon oxide, silicon oxynitride, or silicon nitride. The thickness of the interfacial dielectric layer 40L may be from about 0.1 nm to about 0.8 nm, although lesser and greater thicknesses are also contemplated herein.

For example, the interfacial dielectric layer 40L may be a "chemical oxide," which is formed by treatment of a top surface of the substrate semiconductor layer 10 with a chemical. The process step for this wet chemical oxidation typically includes treating a cleaned semiconductor surface (such as a semiconductor surface treated with hydrofluoric acid) with a mixture of ammonium hydroxide, hydrogen peroxide and water (in a 1:1:5 ratio) at 65° C. Alternately, the chemical oxide layer can also be formed by treating the HF-last semiconductor surface in ozonated aqueous solutions, with the ozone concentration usually varying from, but not limited to, a range from about 2 parts per million (ppm) to about 40 ppm.

A high dielectric constant (high-k) gate dielectric layer 42L is formed directly on the interfacial dielectric layer 40L by methods well known in the art including, for example, chemical vapor deposition (CVD), physical vapor deposition (PVD), molecular beam deposition (MBD), pulsed laser deposition (PLD), liquid source misted chemical deposition (LSMCD), atomic layer deposition (ALD), etc. The high-k gate dielectric layer 42L comprises a dielectric metal oxide having a dielectric constant that is greater than the dielectric constant of silicon oxide of 3.9. Preferably, the high-k gate dielectric layer 42L has a dielectric constant greater than 8.0. The dielectric metal oxide is a high-k material containing a metal and oxygen, and is known in the art as high-k gate dielectric materials. Exemplary high-k dielectric material include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, an alloy hereof, and a non-stoichiometric variant thereof. Each value of x is independently from about 0.5 to about 3 and each value of y is independently from 0 to about 2. The thickness of the high-k gate dielectric layer 42L may be from about 0.9 nm to about 6 nm, and preferably from about 1.2 nm to about 3 nm. The high-k gate dielectric layer 42L may have an effective oxide thickness on the order of or less than 1 nm.

The interfacial dielectric layer 40L and the high-k gate dielectric layer 42L collectively constitute a high-k gate dielectric stack. Variations of the present invention in which the high-k gate dielectric stack described herein is replaced with another functionally equivalent gate dielectric stack comprising a high-k gate dielectric layer and at least another dielectric material layer are explicitly contemplated herein.

Figure 4:
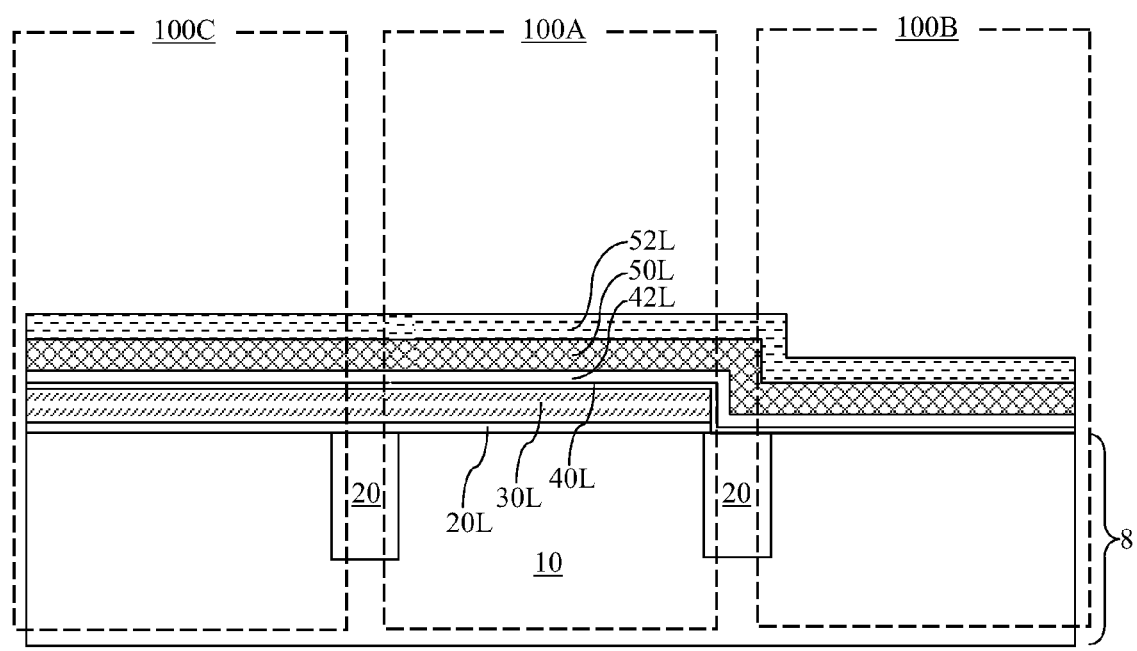

Referring to FIG. 4, a metal gate layer 50L is formed on the gate dielectric layer 30L, for example, by chemical vapor deposition (CVD), physical vapor deposition (PVD), atomic layer deposition (ALD), etc. The metal gate layer 50L comprises a metallic material which may comprise an elemental metal, a metal alloy, a conductive metal oxide, and/or a conductive metal nitride.

In one embodiment, the metal gate layer 50L has a work function between a valence band edge of the semiconductor material of the substrate semiconductor layer 10 and a mid-band-gap energy level of the semiconductor material of the substrate semiconductor layer 10. For example, if the semiconductor material is silicon, the metallic material may comprise one of Ru, Pd, Pt, Co, Ni, $Ta_xAl_yN$, $W_xC_yN$, a conductive metal oxide, and a combination thereof. Each value of x is independently from 0 to about 1 and each value of y is independently from 0 to about 1.

In an alternate embodiment, the metal gate layer 50L has a work function between a conduction band edge of the semiconductor material of the substrate semiconductor layer 10 and a mid-band-gap energy level of the semiconductor material of the substrate semiconductor layer 10. For example, if the semiconductor material is silicon, the metallic material may comprise one of Zr, W, Ta, Hf, Ti, Al, a metal carbide, a transition metal aluminide, and a combination thereof. Exemplary transition metal aluminide include $Ti_3Al$ and ZrAl.

The thickness of the metal gate layer 50L may be from about 3 nm to about 100 nm, and preferably from about 5 nm to about 30 nm. Preferably, the composition of the metal gate layer 50L, and as a consequence, the work function of the metal gate layer 50L, is selected to optimize the threshold voltage of a transistor to be subsequently formed in the second device region 100B.

An optional semiconductor material layer 52L may be formed directly on the metal gate layer 50L by deposition methods well known in the art. The optional semiconductor material layer 52L may comprise a polycrystalline or amorphous semiconductor material, which includes at least one of silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. The optional semiconductor material layer 52L may be deposited with in-situ doping as a doped semiconductor material layer, or may be deposited as an undoped semiconductor material layer and subsequently doped by ion implantation. The thickness of the optional semiconductor material layer 52L may be from about 10 nm to about 120 nm, although lesser and greater thicknesses are also explicitly contemplated herein. The optional semiconductor material layer 52 may, or may not be doped as deposited. In case the optional semiconductor material layer 52 is not doped as deposited, dopants may be introduced either by ion implantation or by diffusion from a second doped semiconductor layer to be subsequently formed so that the entirety of the stack of the metal gate layer 50L and the optional semiconductor material layer 52L is highly electrically conductive.

Figure 5:
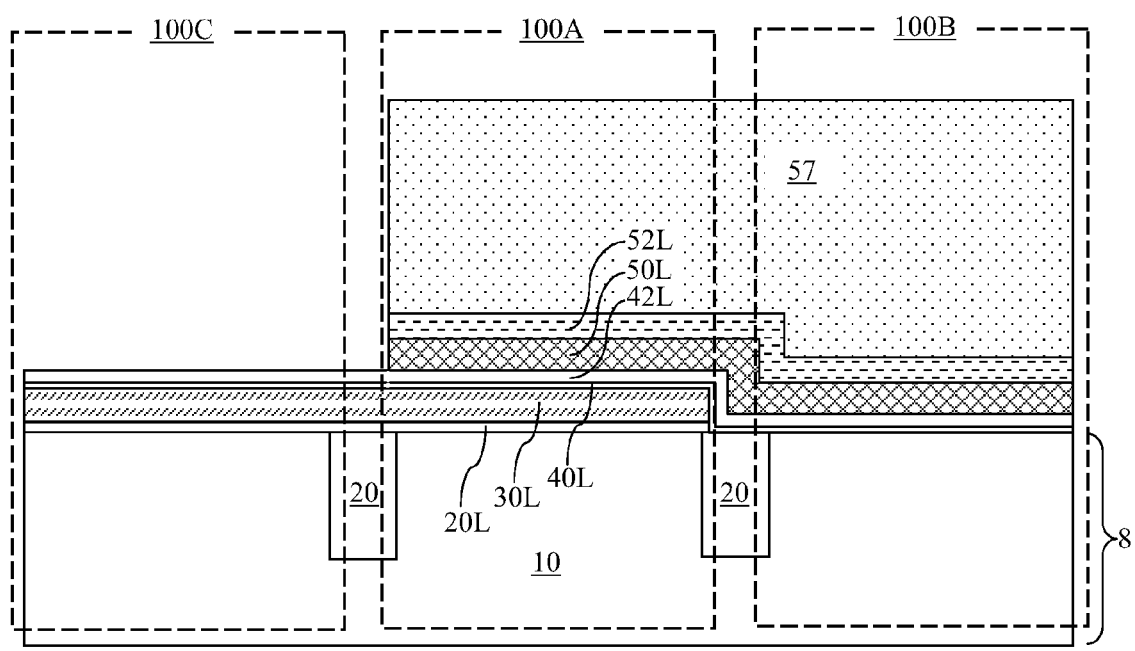

Referring to FIG. 5, a second photoresist 57 is applied over the optional semiconductor material layer 52L and lithographically patterned so that the portion of the stack of the optional semiconductor material layer 52L and the metal gate layer 50L in the first and second device regions (100A, 100B) is covered by the second photoresist 37, while the portion of the stack of the optional semiconductor material layer 52L and the metal gate layer 50L in the third device region 100C is exposed. Employing the second photoresist 57 as an etch mask, the portion of the stack of the optional semiconductor material layer 52L and the metal gate layer 50L in the third device region 100C is removed by an etch, which may be a dry etch or a wet etch. A top surface of the high-k gate dielectric layer 42L is exposed in the third device region 100C.

Figure 6:
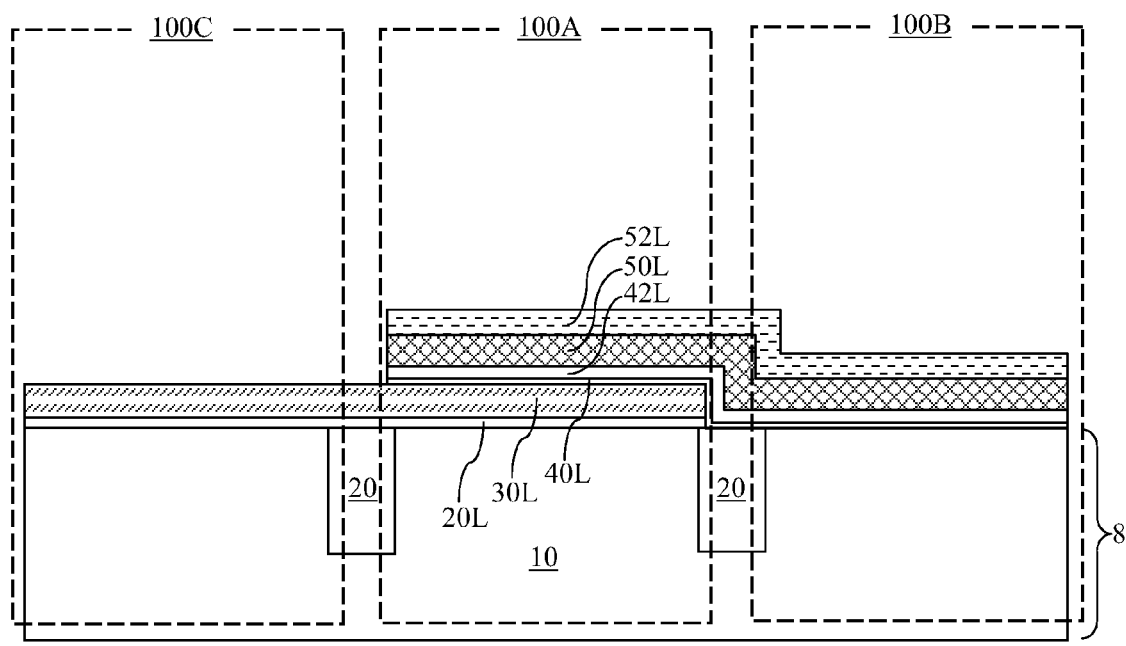

Referring to FIG. 6, employing the second photoresist 57 as an etch mask, the portion of the high-k gate dielectric layer 42L and the interfacial dielectric layer 40L in the third device region 100C are removed by an etch, which may be a dry etch or a wet etch. A top surface of the first doped semiconductor layer 30L is exposed in the third device region 100C. The second photoresist 57 is subsequently removed. A suitable surface clean may be performed at this step as needed to prevent formation of any interfacial oxide over the exposed portions of the first doped semiconductor layer 30L.

Figure 7:
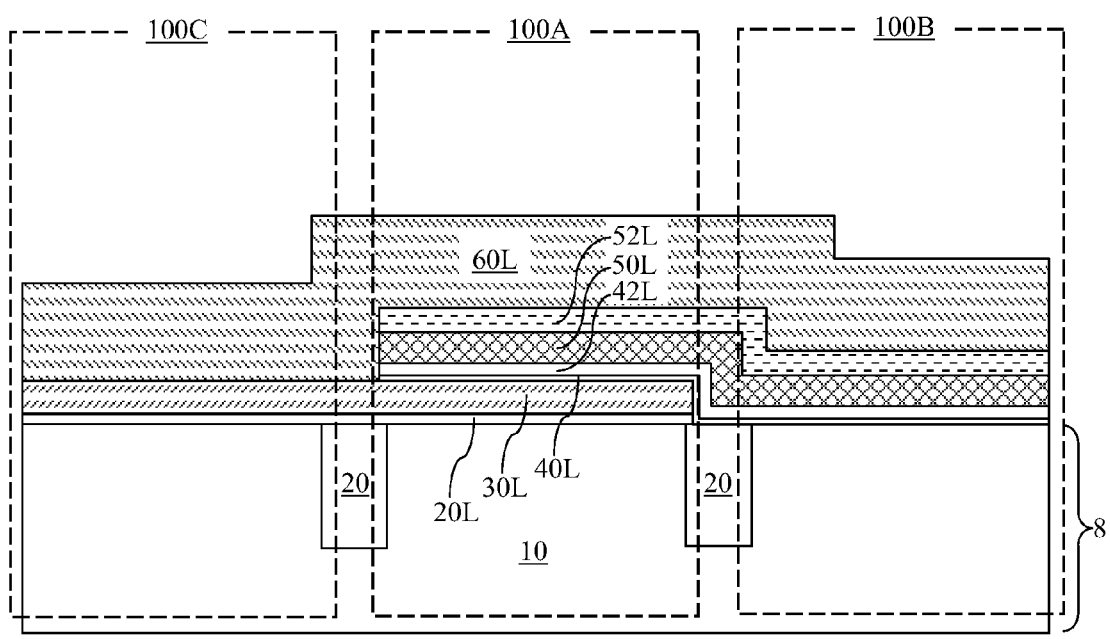

Referring to FIG. 7, a second doped semiconductor layer 60L is formed on the top surface of the optional semiconductor material layer 52L in the first and second device regions (100A, 100B) and on the exposed surfaces of the first doped semiconductor layer 30L in the third device region. The second doped semiconductor layer 60L may be formed by chemical vapor deposition (CVD) such as low pressure chemical vapor deposition (LPCVD), rapid thermal chemical vapor deposition (RTCVD), plasma enhanced chemical vapor deposition (PECVD), etc. The second doped semiconductor layer 60L may be formed by deposition of an undoped layer of semiconductor layer followed by implantation of dopants. If ion implantation is employed, the ion implantation may be performed into the entirety of the second doped semiconductor layer 60L without employing a mask, or alternately, the ion implantation may be performed with at least one implantation mask to change the dopant type or dopant concentration across the various device regions (100A-100C). Instead of employing ion implantation, the second doped semiconductor layer 60L may be formed by deposition of in-situ doped layer of a semiconductor material.

The second doped semiconductor layer 60L may be amorphous or polycrystalline, and comprises a semiconductor material such as silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. The second doped semiconductor layer 60L may comprise the same material as, or a different material from, the first doped semiconductor layer 30L. Also, the second doped semiconductor layer 60L may comprise the same material as, or a different material from, the optional semiconductor material layer 52L. The thickness of the second doped semiconductor layer 60L may be from about 30 nm to about 300 nm, and typically from about 60 nm to about 150 nm, although lesser and greater thicknesses are also explicitly contemplated herein.

Preferably, the type of doping of the second doped semiconductor layer 60L in the third device region 100C is the same as the type of doping as the type of doping of the first doped semiconductor layer 30L to provide a gate electrode in the third device region 100C that does not include a built-in p-n junction. In other words, the portion of the second doped semiconductor layer 60L in the third device region 100C and the first doped semiconductor layer 30L have the same type of doping, which is a p-type doping or an n-type doping. Other portions of the second doped semiconductor layer 60L in the first and second device regions (100A, 100B) may have a p-type doping or an n-type doping, i.e., may have the same type of doping as, or may have an opposite type of doping of, the first doped semiconductor layer 30L.

Figure 8:
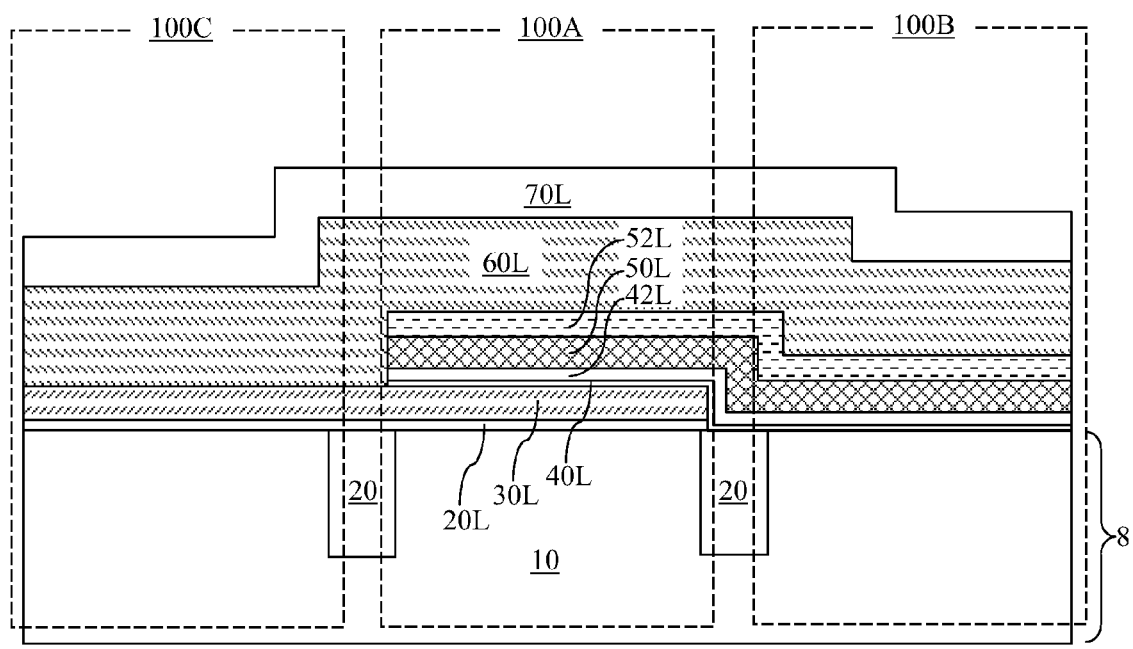

Referring to FIG. 8, a hard mask layer 70L is formed on the second doped semiconductor layer 60L by chemical vapor deposition (CVD) such as low pressure chemical vapor deposition (LPCVD), rapid thermal chemical vapor deposition (RTCVD), plasma enhanced chemical vapor deposition (PECVD), etc. The hard mask layer 70L comprises a dielectric material such as a dielectric oxide or a dielectric nitride. For example, the hard mask layer 70L may comprise silicon oxide or silicon nitride. The thickness of the hard mask layer 70L may be from about 20 nm to about 200 nm, and typically from about 50 nm to about 120 nm, although lesser and greater thicknesses are also contemplated herein.

Figure 9:
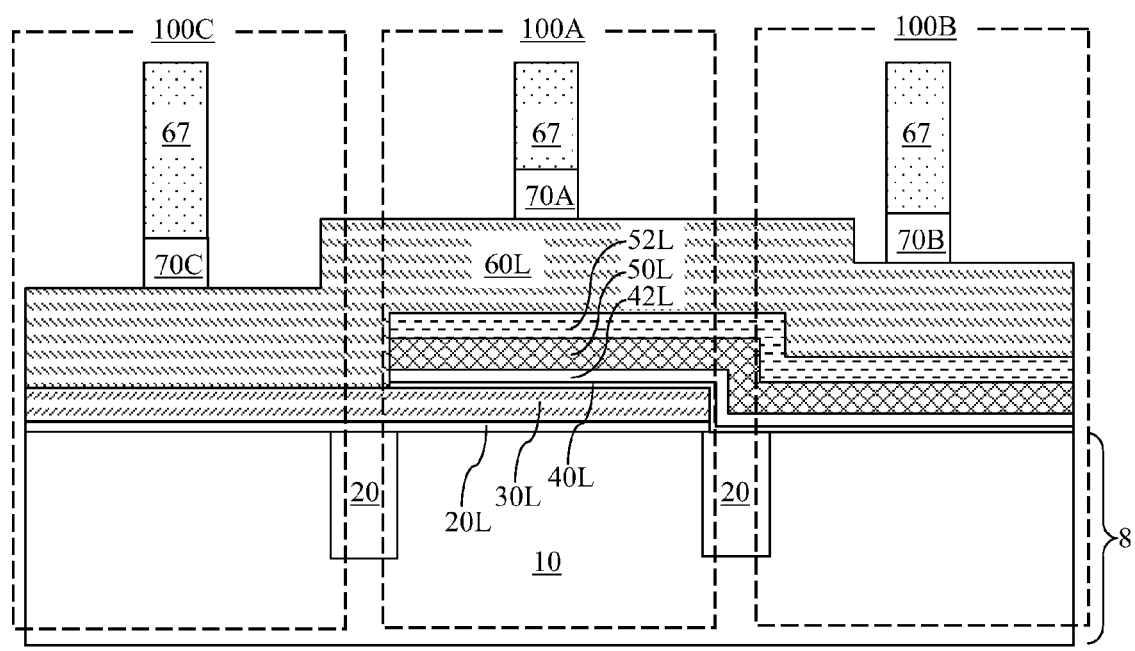

Referring to FIG. 9, a third photoresist 67 is applied over the hard mask layer 70L and lithographically patterned by exposure to light and development. The pattern in the third photoresist 67 includes patterns for gate lines for transistors to be subsequently formed in the various device regions (100A-100C). The pattern in the third photoresist 67 is transferred into the hard mask layer 70L by an anisotropic etch to form a first hard mask portion 70A in the first device region 100A, a second hard mask portion 70B in the second device region 100B, and a third hard mask portion 70C in the third device region 100C.

Figure 10:
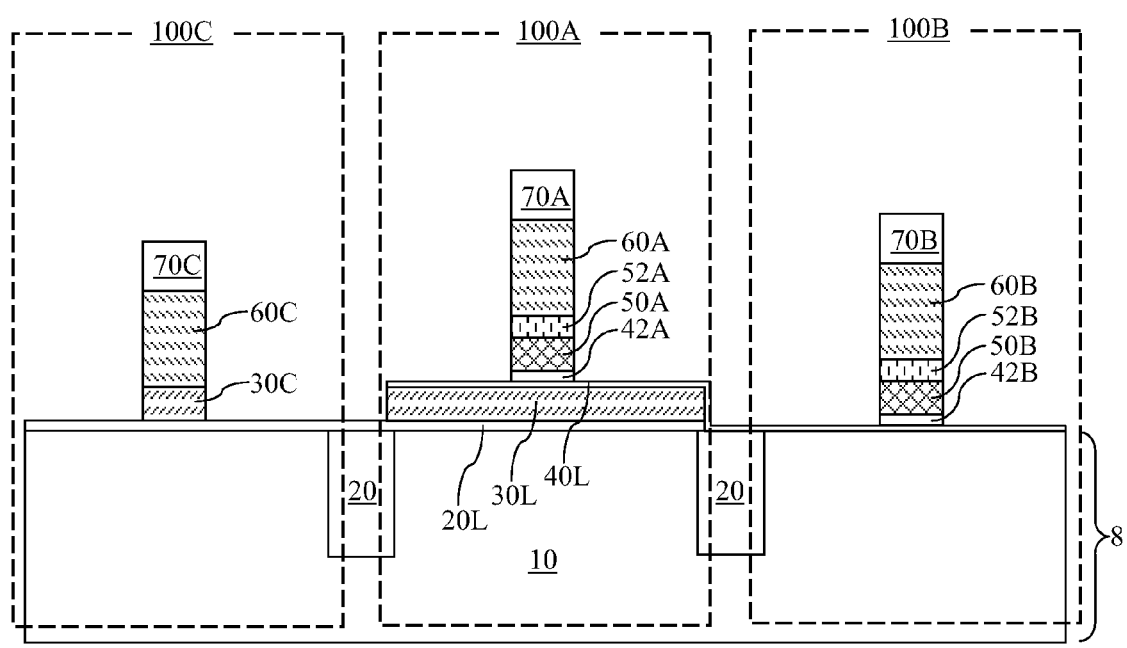

Referring to FIG. 10, the third photoresist 67 is removed and the pattern of the various hard mask portions (70A-70C) is transferred by an anisotropic etch into the underlying layers including the second doped semiconductor layer 60L, the optional semiconductor material layer 52L, the metal gate layer 50L, and the first doped semiconductor layer 30L. The pattern of the third hard mask portion 70C is transferred through the second doped semiconductor layer 60L and into the first doped semiconductor layer 30L in the third device region 100C. Preferably, the pattern transfer in the third device region stops on the semiconductor oxide containing gate dielectric layer 20L, i.e., the anisotropic etch is selective to the material of the semiconductor oxide containing gate dielectric layer 20L. The patterns of the first hard mask portion 70A and the second hard mask portion 70B are transferred through the second doped semiconductor layer 60L, the optional semiconductor material layer 52L, and the metal gate layer 50L in the first and second device regions (100A, 100B). The pattern of the various hard mask portions (70A-70C) may, or may not, be transferred into the high-k gate dielectric layer 42L in the first and second device regions (100A, 100B). While the present invention is described for an embodiment in which the high-k gate dielectric layer 42L is patterned in the first and second device regions (100A, 100B) and the anisotropic etch is selective to the interfacial dielectric layer 40L, embodiments are explicitly contemplated in which the pattern transfer stops on the top surface of the first semiconductor layer 30L in the first device region 100A and the top surface of the substrate semiconductor layer in the second device region 100B, or a top surface of the high-k gate dielectric layer 42L.

The anisotropic etch forms a second doped semiconductor first-region portion 60A, a first optional semiconductor material portion 52A, and a first metal gate portion 50A in the first device region 100A. A first high-k gate dielectric portion 42A may also be formed in the first device region 100A. Sidewalls of the second doped semiconductor first-region portion 60A, the first optional semiconductor material portion 52A, the first metal gate portion 50A, and the first high-k gate dielectric portion 42A are substantially vertically coincident. The anisotropic etch forms a second doped semiconductor second-region portion 60B, a second optional semiconductor material portion 52B, and a second metal gate portion 50B in the second device region 100B. A second high-k gate dielectric portion 42B may also be formed in the second device region 100B. Sidewalls of the second doped semiconductor first-region portion 60B, the second optional semiconductor material portion 52B, the second metal gate portion 50B, and the second high-k gate dielectric portion 42B are substantially vertically coincident. The anisotropic etch also forms a second doped semiconductor third-region portion 60C and a first doped semiconductor third-region portion 30C in the third device region 100C. The sidewalls of the second doped semiconductor third-region portion 60C and the first doped semiconductor third-region portion 30C are substantially vertically coincident.

Figure 11:
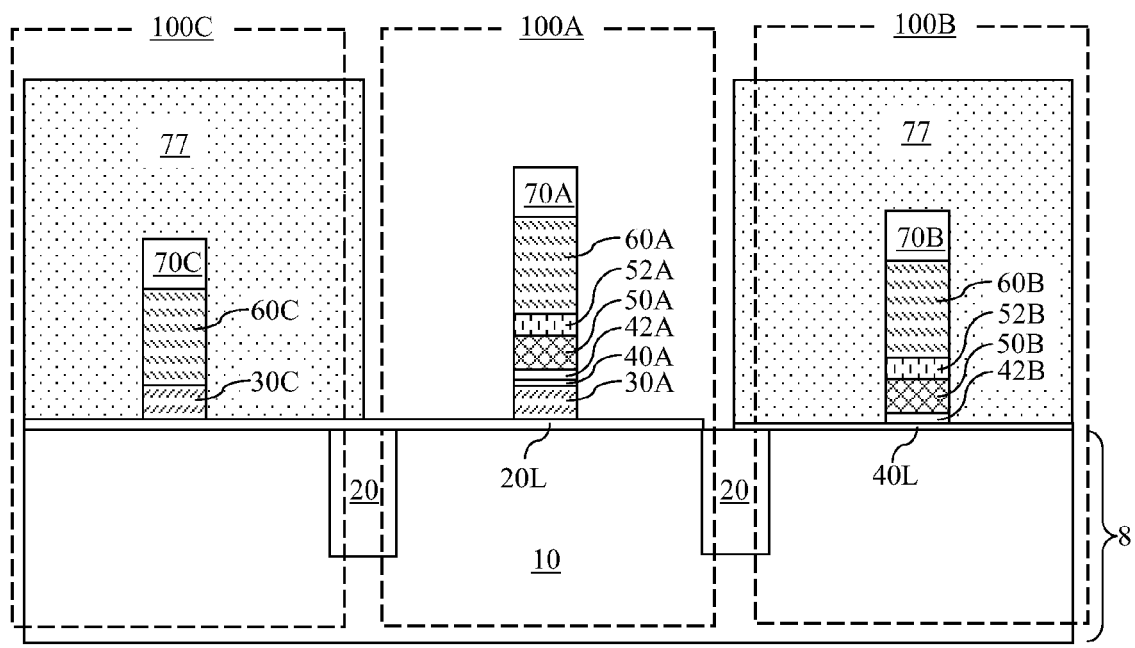

Referring to FIG. 11, a fourth photoresist 77 is applied over the semiconductor substrate 8 and the various hard mask portions (70A-70C) and lithographically patterned to cover the structures in the second and third device regions (100B, 100C), while exposing the structures in the first device region. Employing a combination of the first hard mask portion 70A and the remaining portion of the fourth photoresist 77, the pattern of the first hard mask portion 70A is transferred into the stack of the interfacial dielectric layer 40L and the first doped semiconductor layer 30L, and optionally into the semiconductor oxide containing gate dielectric layer 20L. The remaining portion of the interfacial dielectric layer 40L in the first device region 100A constitutes a first interfacial dielectric portion 40A. The remaining portion of the first doped semiconductor layer 30L constitutes a first doped semiconductor first-region portion 30A. Sidewalls of the first interfacial dielectric portion 40A and the first doped semiconductor first-region portion 30A are substantially vertically coincident with the sidewalls of the second doped semiconductor first-region portion 60A, the first optional semiconductor material portion 52A, the first metal gate portion 50A, and the first high-k gate dielectric portion 42A.

Figure 12:
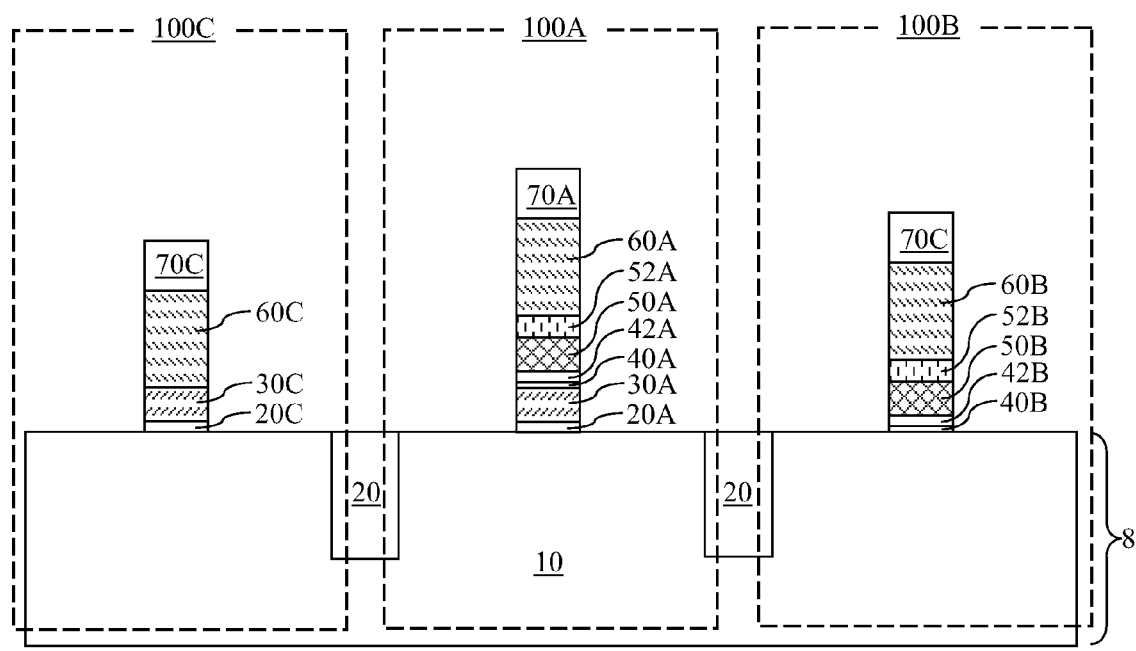

Referring to FIG. 12, the fourth photoresist 77 is removed. The exposed portions of the semiconductor oxide containing gate dielectric layer 20L and the interfacial dielectric layer 40L are removed by an etch, which may be a wet etch or a dry etch. In case an anisotropic etch is employed to remove the exposed portions of the semiconductor oxide containing gate dielectric layer 20L and the interfacial dielectric layer 40L, the various hard mask portions (70A-70C) are employed as an etch mask. The remaining portion of the semiconductor oxide containing gate dielectric layer 20L in the first device region constitutes a first semiconductor oxide containing gate dielectric portion 20A. The remaining portion of the semiconductor oxide containing gate dielectric layer 20L in the third device region constitutes a second semiconductor oxide containing gate dielectric portion 20C. The remaining portion of the interfacial dielectric layer 40L in the second device region 100B constitutes a second interfacial dielectric portion 40B.

The first exemplary semiconductor structure comprises a first gate stack located in the first device region 100A, a second gate stack located in the second device region 100B, and a third gate stack located in the third device region 100C. The first gate stack comprises, from bottom to top, the first semiconductor oxide containing gate dielectric portion 20A, the first doped semiconductor first-region portion 30A, the first interfacial dielectric portion 40A, first high-k gate dielectric portion 42A, the first metal gate portion 50A, the first optional semiconductor material portion 52A, and the second doped semiconductor first-region portion 60A. The first hard mask portion 70A located directly on the first gate stack has sidewalls that are substantially vertically coincident with sidewalls of all layers in the first gate stack.

The first gate stack comprises a first semiconductor gate electrode and a first metal-semiconductor-stack gate electrode. The first semiconductor gate electrode comprises the first doped semiconductor first-region portion 30A. The first metal-semiconductor-stack gate electrode comprises a stack of the first metal gate portion 50A, the first optional semiconductor material portion 52A, and the second doped semiconductor first-region portion 60A. The first gate electrode is separated from, and electrically insulated from, the semiconductor substrate 8 by the first semiconductor oxide containing gate dielectric portion 20A, and is separated from, and electrically insulated from, the first metal-semiconductor-stack gate electrode by the stack of the first interfacial dielectric portion 40A and first high-k gate dielectric portion 42A. The stack of the first optional semiconductor material portion 52A and the second doped semiconductor first-region portion 60A collectively constitute a first doped semiconductor portion (52A, 60A), in which the first optional semiconductor material portion 52A is a lower doped semiconductor sub-portion, and the second doped semiconductor first-region portion 60A is an upper doped semiconductor sub-portion.

The second gate stack comprises, from bottom to top, the second interfacial dielectric portion 40B, the second high-k gate dielectric portion 42A, the second metal gate portion 50B, the second optional semiconductor material portion 52B, and the second doped semiconductor second-region portion 60B. The second hard mask portion 70B located directly on the second gate stack has sidewalls that are substantially vertically coincident with sidewalls of all layers in the second gate stack.

The second gate stack comprises a second metal-semiconductor-stack gate electrode. The second metal-semiconductor-stack gate electrode comprises a stack of the second metal gate portion 50B, the second optional semiconductor material portion 52B, and the second doped semiconductor second-region portion 60B. The second gate electrode is separated from, and electrically insulated from, the semiconductor substrate 8 by the stack of the second interfacial dielectric portion 40B and second high-k gate dielectric portion 42B. The stack of the second optional semiconductor material portion 52B and the second doped semiconductor second-region portion 60B collectively constitute a second doped semiconductor portion (52B, 60B), in which the second optional semiconductor material portion 52B is a lower doped semiconductor sub-portion, and the second doped semiconductor second-region portion 60B is an upper doped semiconductor sub-portion.

The third gate stack comprises, from bottom to top, the second semiconductor oxide containing gate dielectric portion 20C, the first doped semiconductor third-region portion 30C, and the second doped semiconductor third-region portion 60C. The third hard mask portion 70C located directly on the third gate stack has sidewalls that are substantially vertically coincident with sidewalls of all layers in the third gate stack.

The third gate stack comprises a second semiconductor gate electrode. The second semiconductor gate electrode comprises the second doped semiconductor first-region portion 30A. The second semiconductor gate electrode comprises a stack of the first doped semiconductor third-region portion 30C and the second doped semiconductor third-region portion 60C. The second semiconductor gate electrode is separated from, and electrically insulated from, the semiconductor substrate 8 by the second semiconductor oxide containing gate dielectric portion 20C. The first doped semiconductor third-region portion 30C is a lower doped semiconductor sub-portion of the second semiconductor gate electrode (30C, 60C), and the second doped semiconductor third-region portion 60C is an upper doped semiconductor sub-portion of the second semiconductor gate electrode (30C, 60C).

Figure 13:
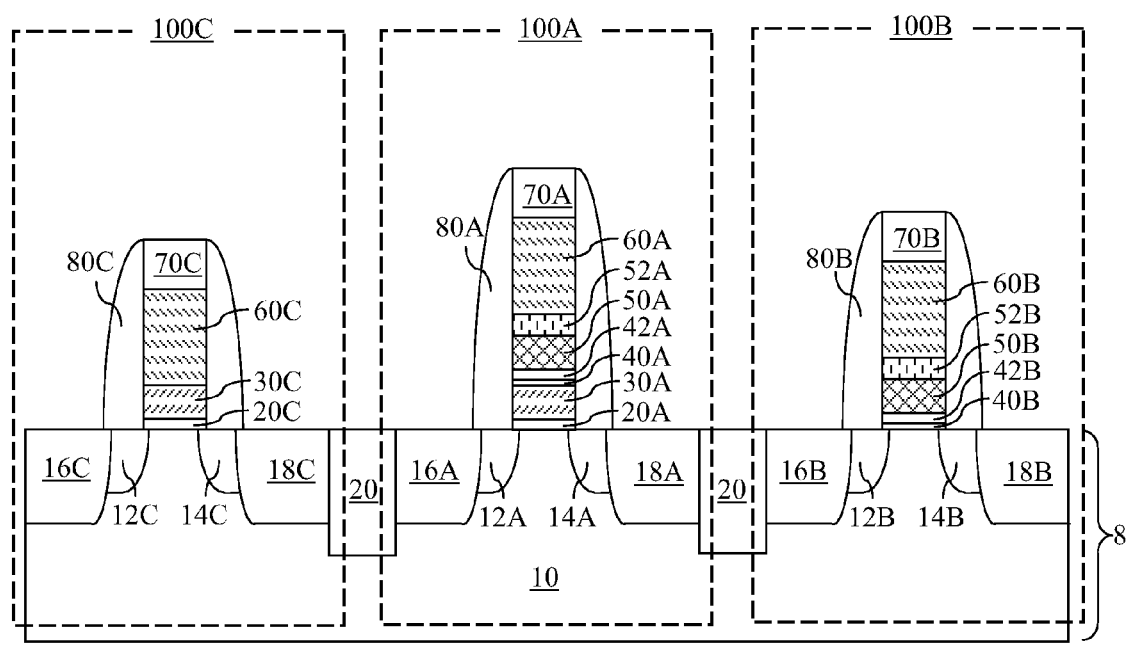

Referring to FIG. 13, source and drain extension regions and source and drain regions are formed in the semiconductor substrate 8, and gate spacers are formed on the various gate stacks to form field effect transistors. Specifically, a first field effect transistor including the first semiconductor gate electrode 30A, the first metal-semiconductor-stack gate electrode (50A, 52A, 60A), a first source extension region 12A, a first drain extension region 14A, a first source region 16A, a first drain region 18A, and a first gate spacer 80A is formed in the first device region 100A. The first field effect transistor may be employed as a flash memory device in which electrical charges are stored in the first semiconductor gate electrode 30A. Operational principles of a flash memory device are well known in the art.

A second field effect transistor including the second metal-semiconductor-stack gate electrode (50B, 52B, 60B), a second source extension region 12B, a second drain extension region 14B, a second source region 16B, a second drain region 18B, and a second gate spacer 80B is formed in the second device region 100B. The second field effect transistor may be a p-type field effect transistor and an n-type field effect transistor.

A third field effect transistor including the second semiconductor gate electrode (30C, 60C), a third source extension region 12C, a third drain extension region 14C, a third source region 16C, a third drain region 18C, and a third gate spacer 80C is formed in the third device region 100C. The third field effect transistor may be an n-type field effect transistor and a p-type field effect transistor.

The work function of the second metal-semiconductor-stack gate electrode (50B, 52B, 60B) is determined by the material properties of the second metal gate portion 50B, and the work function of the second semiconductor gate electrode (30C, 60C) is determined by the material properties of the first doped semiconductor third-region portion 30C. Thus, the work function may be independently determined for the second field effect transistor and the third field effect transistor. Two different types of devices may be formed, each having a gate electrode having a work function from the other type of devices, in the second and third device regions (100B, 100C). Typically, the second field effect transistor is a p-type field effect transistor and the third field effect transistor is an n-type field effect transistor, or vice versa.

Figure 14:
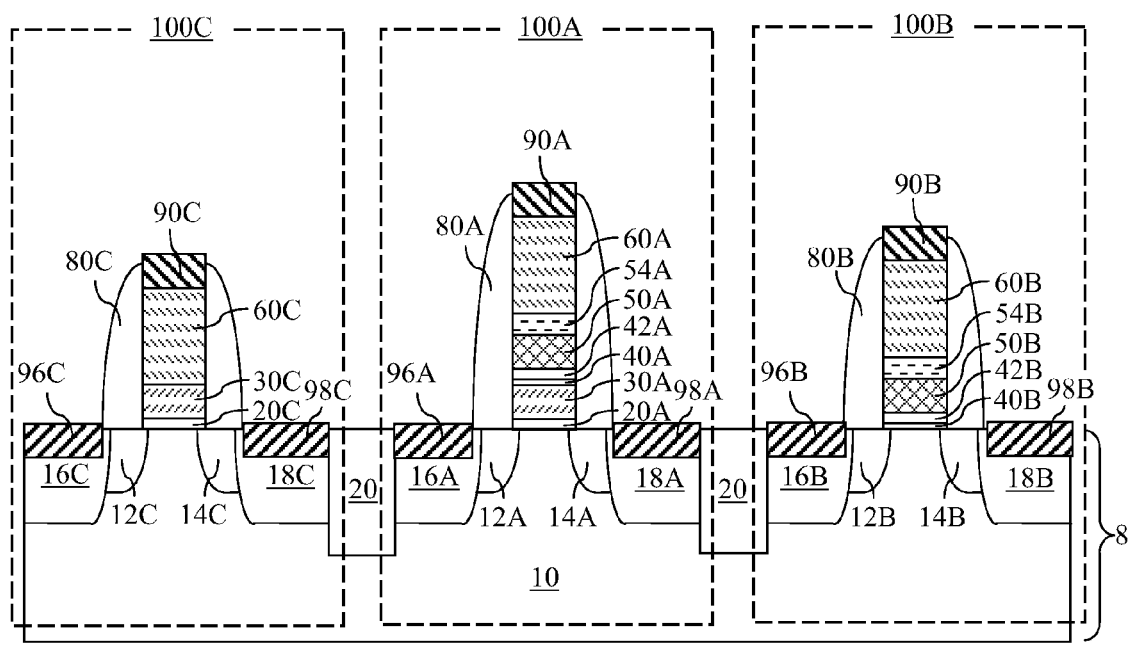

Referring to FIG. 14, the first, second, and third hard mask portions (70A-70C) are removed, and various metal semiconductor alloys are formed by reacting a metal with the semiconductor materials on exposed semiconductor surfaces. Specifically, a first gate metal semiconductor alloy portion 90A is formed by reacting the metal with an upper portion of the second doped semiconductor first-region portion 60A in the first device region 100A, a second gate metal semiconductor alloy portion 90B is formed by reacting the metal with an upper portion of the second doped semiconductor second-region portion 60B in the second device region 100B, and a third gate metal semiconductor alloy portion 90C is formed by reacting the metal with an upper portion of the second doped semiconductor third-region portion 60C in the third device region 100C. A first source side metal semiconductor alloy portion 96A and a first drain side metal semiconductor alloy portion 98A are formed directly on the first source region 16A and the first drain region 18A, respectively, in the first device region 100A. A second source side metal semiconductor alloy portion 96B and a second drain side metal semiconductor alloy portion 98B are formed directly on the second source region 16B and the second drain region 18B, respectively, in the second device region 100B. A third source side metal semiconductor alloy portion 96C and a third drain side metal semiconductor alloy portion 98C are formed directly on the third source region 16C and the third drain region 18C, respectively, in the third device region 100C. In case the underlying semiconductor material comprises silicon, the resulting metal semiconductor alloy portion comprises a metal silicide. In case the underlying semiconductor material comprises germanium, the resulting metal semiconductor alloy portion comprises a metal germanide.

According to the present invention, three distinct types of gate electrode structures are provided, two of which comprise a single gate electrode, and the remaining type comprising a double gate electrode with an intermediate gate electrode that comprises a doped semiconductor material. The two types enable formation of two distinct types of field effect transistor having different work functions for the gate electrode. The double gate electrode enabled by the third type enables formation of semiconductor devices requiring two gate electrodes such as a flash memory device.

Figure 15:
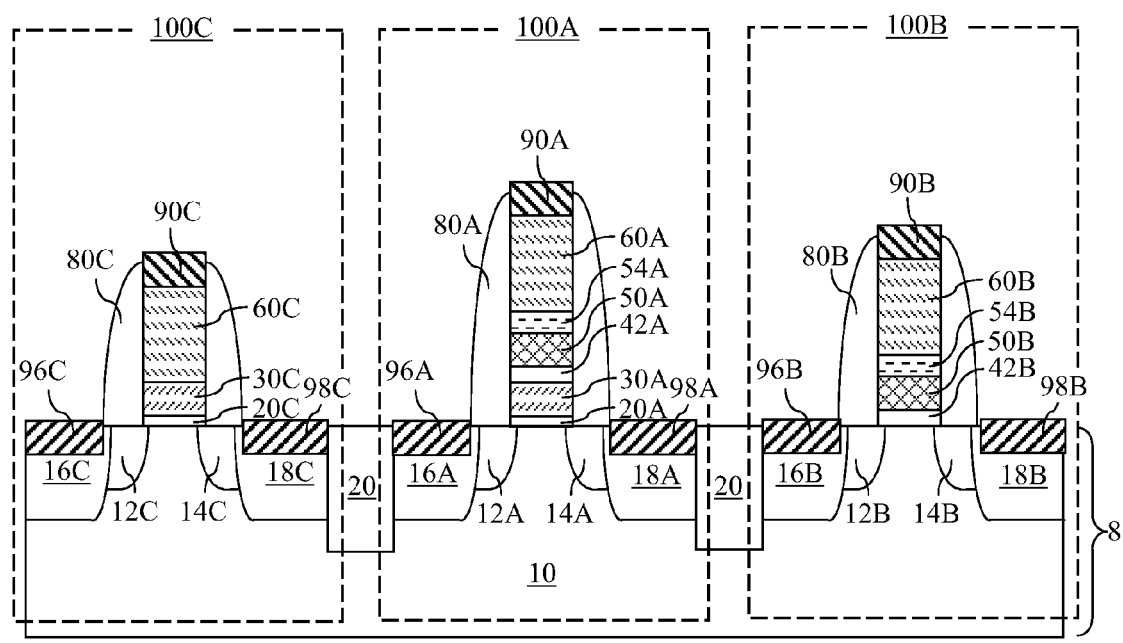
FIG. 15 is a vertical cross-sectional view of a second exemplary semiconductor structure according to a second embodiment of the present invention.

Referring to FIG. 15, a second exemplary semiconductor structure according to a second embodiment of the present invention is derived from the first exemplary semiconductor structure by omitting the formation of the interfacial dielectric layer 40L in the first exemplary semiconductor structure. At a processing step corresponding to FIG. 3, the high-k gate dielectric layer 42L is formed directly on the top surface of the first doped semiconductor layer 30L and the exposed surface of the substrate semiconductor layer 10 in the second device region 100B. Thus, the first gate stack in the first device region 100A comprises, from bottom to top, the first semiconductor oxide containing gate dielectric portion 20A, the first doped semiconductor first-region portion 30A, the first high-k gate dielectric portion 42A, the first metal gate portion 50A, the first optional semiconductor material portion 52A, and the second doped semiconductor first-region portion 60A. The second gate stack comprises, from bottom to top, the second high-k gate dielectric portion 42A, the second metal gate portion 50B, the second optional semiconductor material portion 52B, and the second doped semiconductor second-region portion 60B.

Figure 16:
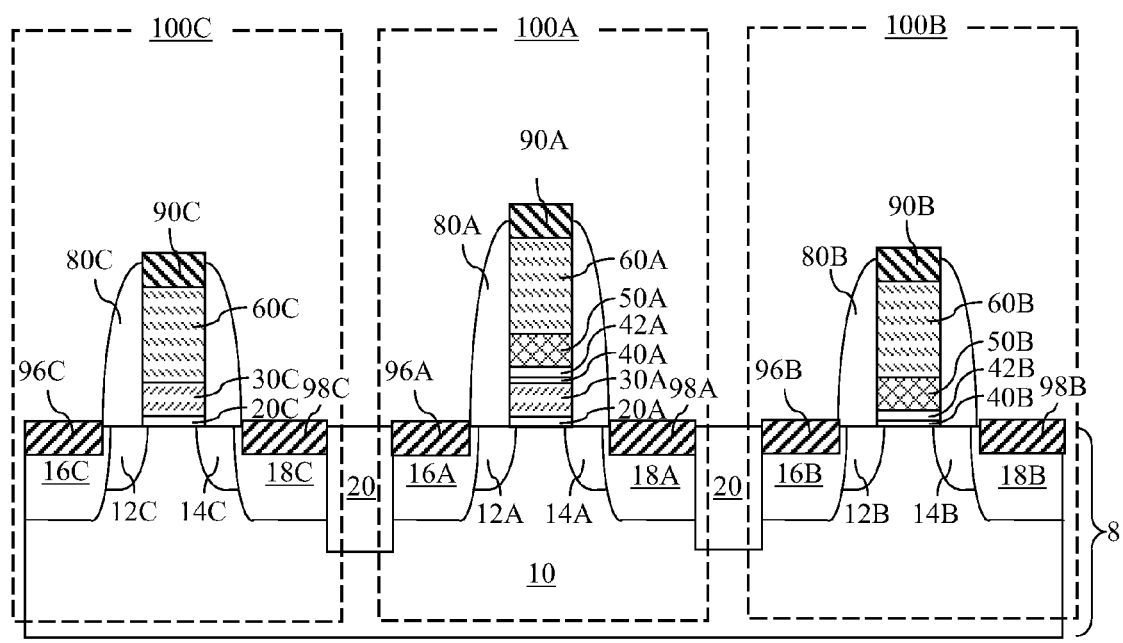
FIG. 16 is a vertical cross-sectional view of a third exemplary semiconductor structure according to a third embodiment of the present invention.

Referring to FIG. 16, a third exemplary semiconductor structure according to a third embodiment of the present invention is derived from the first exemplary semiconductor structure by omitting the formation of the optional semiconductor material layer 52L in the first exemplary semiconductor structure. At a processing step corresponding to FIG. 7, the second doped semiconductor layer 60L is formed directly on the top surface of the metal gate layer 50L and the exposed top surface of the first doped semiconductor layer 30L in the third device region 100C. Thus, the first gate stack in the first device region 100A comprises, from bottom to top, the first semiconductor oxide containing gate dielectric portion 20A, the first doped semiconductor first-region portion 30A, the fist interfacial dielectric portion 40A, the first high-k gate dielectric portion 42A, the first metal gate portion 50A, and the second doped semiconductor first-region portion 60A. The second gate stack comprises, from bottom to top, the second interfacial dielectric portion 40B, the second high-k gate dielectric portion 42A, the second metal gate portion 50B, and the second doped semiconductor second-region portion 60B.

Figure 17:
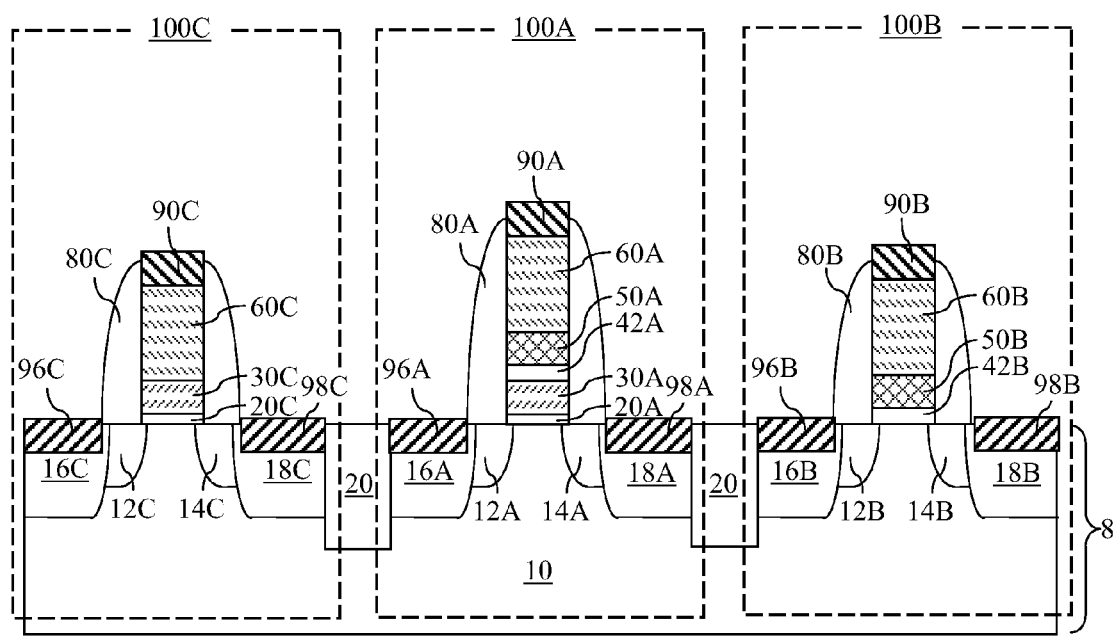
FIG. 17 is a vertical cross-sectional view of a fourth exemplary semiconductor structure according to a fourth embodiment of the present invention.

Referring to FIG. 17, a fourth exemplary semiconductor structure according to a fourth embodiment of the present invention is derived from the second exemplary semiconductor structure by omitting the formation of the optional semiconductor material layer 52L in the third exemplary semiconductor structure. At a processing step corresponding to FIG. 7, the second doped semiconductor layer 60L is formed directly on the top surface of the metal gate layer 50L and the exposed top surface of the first doped semiconductor layer 30L in the third device region 100C. Thus, the first gate stack in the first device region 100A comprises, from bottom to top, the first semiconductor oxide containing gate dielectric portion 20A, the first doped semiconductor first-region portion 30A, the first high-k gate dielectric portion 42A, the first metal gate portion 50A, and the second doped semiconductor first-region portion 60A. The second gate stack comprises, from bottom to top, the second high-k gate dielectric portion 42A, the second metal gate portion 50B, and the second doped semiconductor second-region portion 60B.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A semiconductor structure comprising:
a first gate stack located in a first device region and a second gate stack located in a second device region, wherein said first and second gate stacks include different material stacks, said first gate stack comprises:
a semiconductor oxide containing gate dielectric portion contacting a top surface of a semiconductor substrate;
a semiconductor gate electrode contacting said semiconductor oxide containing gate dielectric;
a first high-k gate dielectric portion comprising a dielectric metal oxide, having a dielectric constant greater than 4.0, and located above said semiconductor gate electrode;
an interfacial dielectric portion comprising an oxide of a material comprising said semiconductor gate electrode and vertically contacting a top surface of said semiconductor gate electrode and a bottom surface of said first high-k gate dielectric portion; and a first metal-semiconductor-stack gate electrode contacting a top surface of said first high-k gate dielectric portion and comprising a first metal gate portion and a first doped semiconductor portion, wherein a top surface of said first metal gate portion contacts a bottom surface of said first doped semiconductor portion, and wherein said second gate stack comprises:

a second high-k gate dielectric portion comprising said dielectric metal oxide; and a second metal-semiconductor-stack gate electrode contacting a top surface of said second high-k gate dielectric portion and comprising a second metal gate portion and a second doped semiconductor portion, wherein a top surface of said second metal gate portion contacts a bottom surface of said second doped semiconductor portion.

2. The semiconductor structure of claim 1, wherein said first doped semiconductor portion comprises a lower doped semiconductor sub-portion and an upper doped semiconductor sub-portion, wherein said lower doped semiconductor portion contacts said metal gate portion, and wherein said upper doped semiconductor portion contacts a top surface of said lower doped semiconductor portion.

3. The semiconductor structure of claim 2, wherein each of said semiconductor gate electrode, said lower doped semiconductor sub-portion, and said upper doped semiconductor sub-portion comprises one of silicon, germanium, a silicon-germanium alloy, a silicon carbon alloy, a silicon-germanium-carbon alloy, gallium arsenide, indium arsenide, indium phosphide, III-V compound semiconductor materials, II-VI compound semiconductor materials, organic semiconductor materials, and other compound semiconductor materials.

4. The semiconductor structure of claim 1, further comprising:

a gate metal semiconductor alloy portion contacting a top surface of said doped semiconductor portion;

a source region, a source extension region, a drain region, and a drain extension region that are located in said semiconductor substrate, wherein said source extension region and said drain extension contacts said semiconductor oxide containing gate dielectric portion;

a gate spacer laterally contacting sidewalls of each of said semiconductor oxide containing gate dielectric portion, said semiconductor gate electrode, said high-k gate dielectric portion, and said metal gate portion;

a source side metal semiconductor alloy portion contacting said source region; and a drain side metal semiconductor alloy portion contacting said drain region.

5. The semiconductor structure of claim 1, wherein said high-k gate dielectric portion comprises one of $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, an alloy thereof, and non-stoichiometric variants thereof, wherein each value of x is independently from about 0.5 to about 3 and each value of y is independently from 0 to about 2.

6. The semiconductor structure of claim 1, wherein said metal gate portion comprises one of Ru, Pd, Pt, Ca, Ni, $Ta_xAl_yN$, $W_xC_yN$, Ta, Hf, Ti, Al, a metal carbide, a transition metal aluminide, a conductive metal oxide, and a combination thereof, wherein each value of x is independently from 0 to about 1 and each value of y is independently from 0 to about 1.

7. The semiconductor structure of claim 1, further comprising:

a first interfacial dielectric portion comprising an oxide of a material comprising said first semiconductor gate electrode and vertically abutting a top surface of said first semiconductor gate electrode and a bottom surface of said first high-k gate dielectric portion; and a second interfacial dielectric portion comprising a same material as said first interfacial dielectric portion and vertically abutting said top surface of said semiconductor substrate and a bottom surface of said second high-k gate dielectric portion.

8. The semiconductor structure of claim 1, further comprising a third gate stack located in a third device region, wherein said third gate stack comprises:

another semiconductor oxide containing gate dielectric portion abutting said top surface of said semiconductor substrate and comprising a same material as said semiconductor oxide containing gate dielectric portion; and another semiconductor gate electrode comprising a lower doped semiconductor portion and an upper doped semiconductor portion, wherein said lower doped semiconductor portion abuts said another semiconductor oxide containing gate dielectric portion and said upper doped semiconductor portion abuts said lower doped semiconductor portion.

9. The semiconductor structure of claim 8, wherein said lower portion has a same composition as said semiconductor gate electrode, and wherein said upper portion, said first doped semiconductor portion, and said second doped semiconductor portion have a same composition.

10. A semiconductor structure comprising:

a first gate stack located in a first device region and a second gate stack located in a second device region, wherein said first gate stack comprises:

a semiconductor oxide containing gate dielectric portion contacting a top surface of a semiconductor substrate;

a semiconductor gate electrode contacting said semiconductor oxide containing gate dielectric;

a first interfacial dielectric portion comprising an oxide of a material comprising said first semiconductor gate electrode and vertically abutting a top surface of said first semiconductor gate electrode and a bottom surface of said first high-k gate dielectric portion;

a first high-k gate dielectric portion comprising a dielectric metal oxide, having a dielectric constant greater than 4.0, and located above said semiconductor gate electrode; and a first metal-semiconductor-stack gate electrode contacting a top surface of said first high-k gate dielectric portion and comprising a first metal gate portion and a first doped semiconductor portion, wherein a top surface of said first metal gate portion contacts a bottom surface of said first doped semiconductor portion, and wherein said second gate stack comprises:

a second interfacial dielectric portion comprising a same material as said first interfacial dielectric portion and vertically abutting said top surface of said semiconductor substrate and a bottom surface of said second high-k gate dielectric portion;

a second high-k gate dielectric portion comprising said dielectric metal oxide and contacting said second interfacial dielectric portion; and a second metal-semiconductor-stack gate electrode contacting a top surface of said second high-k gate dielectric portion and comprising a second metal gate portion and a second doped semiconductor portion, wherein a top surface of said second metal gate portion contacts a bottom surface of said second doped semiconductor portion.

11. The semiconductor structure of claim 10, further comprising a third gate stack located in a third device region, wherein said third gate stack comprises:
   another semiconductor oxide containing gate dielectric portion abutting said top surface of said semiconductor substrate and comprising a same material as said semiconductor oxide containing gate dielectric portion; and
   another semiconductor gate electrode comprising a lower doped semiconductor portion and an upper doped semiconductor portion, wherein said lower doped semiconductor portion abuts said another semiconductor oxide containing gate dielectric portion and said upper doped semiconductor portion contacts said lower doped semiconductor portion.

12. The semiconductor structure of claim 11, wherein said lower portion has a same composition as said semiconductor gate electrode, and wherein said upper portion, said first doped semiconductor portion, and said second doped semiconductor portion have a same composition.

* * * * *